United States Patent [19]
Lin et al.

[11] Patent Number: 6,107,198
[45] Date of Patent: Aug. 22, 2000

[54] AMMONIUM CHLORIDE VAPORIZER COLD TRAP

[75] Inventors: Wei-Farn Lin, Taoyuan; Cheng-Chang Hung, Tainan, both of Taiwan

[73] Assignee: Vanguard International Semiconductor Corporation, Hsin-Chu, Taiwan

[21] Appl. No.: 09/048,212

[22] Filed: Mar. 26, 1998

[51] Int. Cl.[7] .......................... H01L 21/44; H01L 21/31; B05C 11/00; C23C 16/00

[52] U.S. Cl. ........................ 438/680; 438/905; 438/958; 438/963; 438/791; 118/715; 118/724

[58] Field of Search ..................... 438/795, 724, 438/680, 791, 905, 913, 679, 958; 118/715, 716, 724; 427/585, 588

[56] References Cited

U.S. PATENT DOCUMENTS

| | | |
|---|---|---|
| 4,168,741 | 9/1979 | Degenhardt et al. ............ 165/66 |
| 5,015,503 | 5/1991 | Varrin, Jr. et al. ............ 427/255.2 |
| 5,250,323 | 10/1993 | Miyazaki ...................... 427/255.1 |
| 5,261,963 | 11/1993 | Basta et al. ..................... 118/724 |
| 5,536,319 | 7/1996 | Wary et al. ..................... 118/719 |
| 5,584,963 | 12/1996 | Takahashi ...................... 156/646 |
| 5,788,747 | 8/1998 | Horiuchi et al. .................. 95/288 |
| 5,888,579 | 3/1999 | Lun .................................... 427/8 |

*Primary Examiner*—John F. Niebling
*Assistant Examiner*—Ha Tran Nguyen
*Attorney, Agent, or Firm*—George O. Saile; Stephen B. Ackerman

[57] ABSTRACT

The present invention comprises means for sublimating and handling ammonium chloride ($NH_4Cl$) vapor, a bi-product of a silicon nitride growth process, thereby preventing backstreaming into the reactor and ingestion of vapor and particulates by the vacuum pump. The exhaust circuit comprises a novel combination of valves, sublimation and cold traps, cooling and heating elements to facilitate reduction of condensed $NH_4Cl$ volume from a first path trap thus reducing maintenance, increasing production up-time and enhancing product yield.

15 Claims, 5 Drawing Sheets

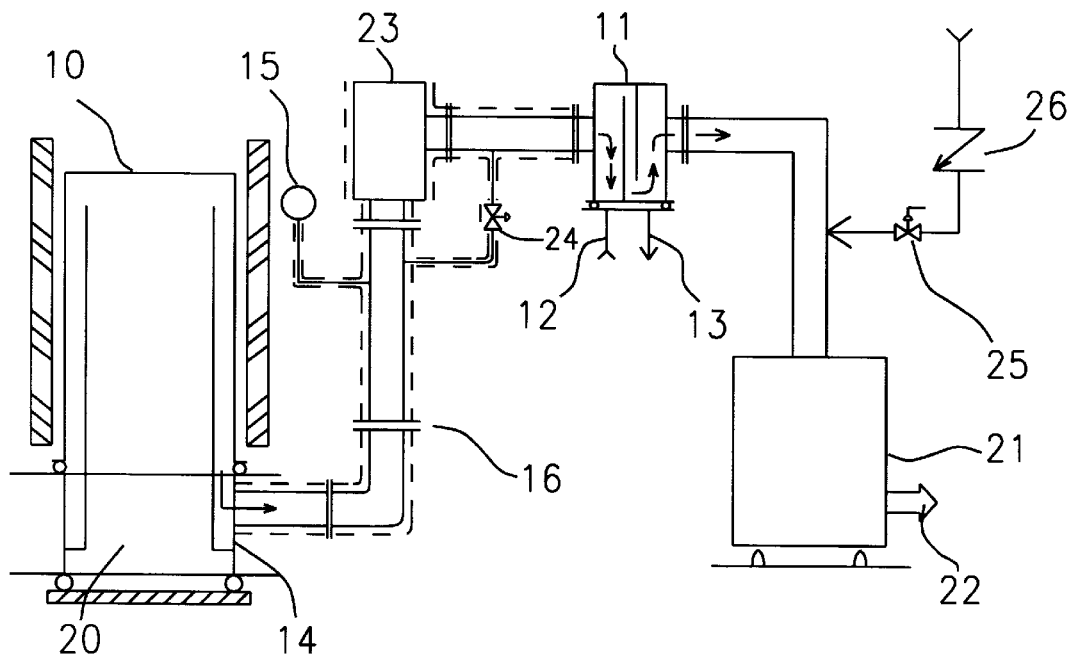
FIG. 1a – Prior Art
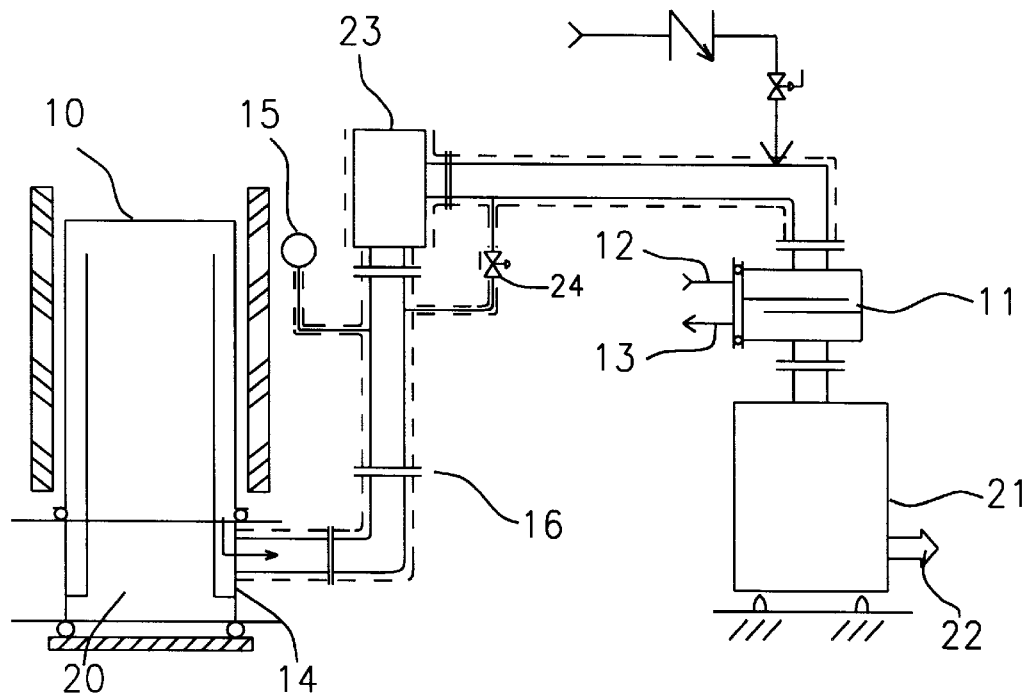
FIG. 1b – Prior Art

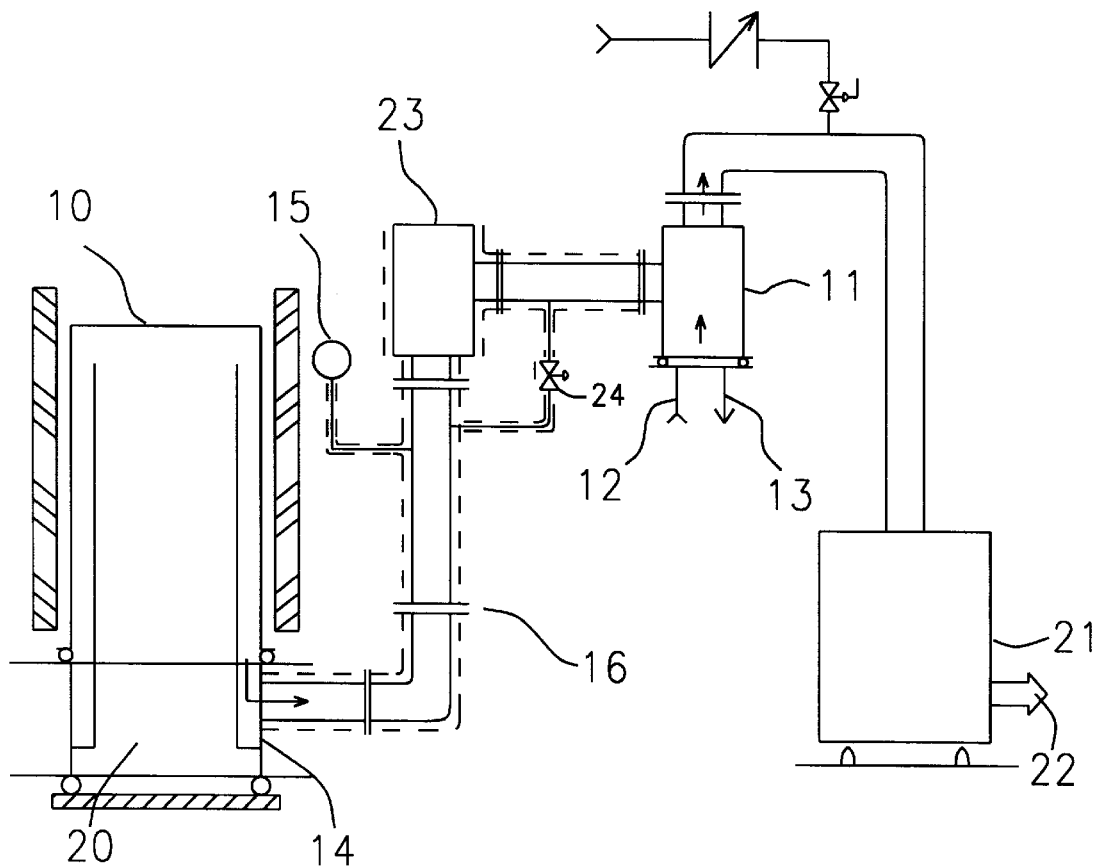
FIG. 1c - Prior Art

AMMONIUM CHLORIDE VAPORIZER COLD TRAP

BACKGROUND OF THE INVENTION

1. Technical Field

This invention relates generally to an apparatus and method for fabricating semiconductor thin films. More specifically, the invention relates to a method and apparatus for effectively reducing process solid buildup during a low pressure chemical vapor deposition film fabrication process.

2. Description of the Prior Art

The following four documents relate to methods dealing with hot and cold traps for isolating source materials from a reaction chamber.

U.S. Pat. No. 4,168,741 issued Sep. 25, 1979 to K. Degenhardt et al., shows an apparatus for ammonia feed in copying equipment.

U.S. Pat. No. 5,015,503 issued May 14, 1991 to R. D. Varrin, Jr. et al., discloses an apparatus for producing compound semiconductor thin films. The apparatus includes hot and cold traps for isolating source materials from the reaction chamber and to provide for controlled delivery of the species. The hot and cold traps communicate with the reaction chamber through hot and cold legs to establish a closed loop circulating flow.

U.S. Pat. No. 5,250,323 issued Oct. 5, 1993 to S. Miyazaki discloses a chemical vapor growth apparatus having an exhaust device including trap. The patent includes a trap for absorbing the source gas remaining in the source gas inlet and the gas flow-rate controller, provided in the first exhaust.

U.S. Pat. No. 5,261,963 issued Nov. 16, 1993 to W. Basta et al., discloses a CVD apparatus comprising exhaust vapor condensation means. The apparatus comprises a reactor having a chamber with a coating region for coating a substrate and an exhaust region. A condensing assembly is disposed in the exhaust region for condensing excess, unreacted gaseous reactant from the spent gas before entry into the outlet. The condensing assembly includes a high surface area, apertured structure disposed in the exhaust region where the temperature of the spent gas stream in sufficiently reduced to condense excess, unreacted gaseous reactant therefrom.

Low pressure chemical vapor deposition (LPCVD) is a well known method for depositing and forming a protective thin film on substrates. Typically, the substrates are loaded into a reaction chamber, heated to a suitable reaction temperature, and exposed in the reactor to one or more elevated temperature gaseous reactants that react with the substrate surfaces to form a coating or layer thereon. The LPCVD deposited coating or layer can be reacted with the substrate by suitable heating in the reactor to form a protective diffusion coating thereon.

An ammonium chloride by-product is produced during a silicon nitride process within a LPCVD reactor while forming a thin silicon nitride layer on a semiconductor substrate. The ammonium chloride is produced in a vapor phase and evacuated through the exhaust port while rapidly crystallizing into a vapor/crystal mix. The vapor/crystal mix is drawn into a cold trap.

By definition, a cold trap functions as a cryopump. System pressure is reduced by a low temperature condensation of vapors in the vacuum system. When a surface is introduced into the system at a temperature low enough to condense the vapor present, the resultant pressure in the system will be that of the vapor pressure of the condensate. As the condensate solidifies, a slight decrease in the temperature of the solid will usually result in a sharp reduction in the vapor pressure. Cryopumping is based on this principle. In some cases traps are used to keep pump fluid vapors (oil or mercury) out of the vacuum circuit or out of other pumps by condensing or freezing these vapors. In other cases, the primary function of a trap is to cut down on the pump-time by pumping various condensable vapors.

Cold traps used in conventional LPCVDs collects and restrains the $NH_4Cl$ solids from entering the vacuum pump. This prevents solids from damaging the pump while permitting evacuation of the vapors. As the build-up of $NH_4Cl$ solids increase within the cold trap, system pressure becomes increasingly difficult to control. Resistance to the evacuation of vapors from the reaction chamber, caused by the increased volume of solids in the cold trap circuit, requires shutting down the LPCVD process for servicing. Maintenance personnel must disassemble and clean the vacuum circuit, hence, reducing equipment process utilization.

FIGS. 1a through 1c schematically illustrate several embodiments of exhaust circuits of the prior art. Each embodiment includes a LPCVD reactor 10 having an exhaust outlet 14, a pressure sensor 15, a first valve 23, a cold trap 11 and a vacuum pump 21 all disposed in series in the order described. A second valve 24 is positioned to give an alternate path for bypassing first valve 23.

During LPCVD preparation, all valves are closed, a semiconductor substrate and a source material, not shown, are placed and sealed inside the reactor tube 20. At the start of the deposition cycle, the second valve 24 is opened to restrict the rush of air from the reactor tube thereby preventing disturbance of $NH_4Cl$ solids, within the exhaust circuit, from being drawn into the vacuum pump 21. As the chamber pressure is reduced to a preset maximum, the first valve 23 is opened to expedite the pressure pump down to a given process pressure. The source material is heated to a preset vaporizing temperature. The vapor surrounds and reacts with the semiconductor substrate forming a nitride protective film thereon while yielding a $NH_4Cl$ byproduct vapor. The byproduct vapors are evacuated and begin to crystallize as exiting into the exhaust outlet 14. As the vapor/crystal mix is pulled into the exhaust circuit, passing through the opened first valve and into cold trap 11. The crystals are trapped and held back permitting only the vapors to be pulled out and vented by pump 21. The temperature of the cold trap 11 is lowered by circulating process cooling water into an attached cold plate having extended conductive surfaces to help solidify and retain the $NH_4Cl$ crystals from being ingested by the pump 21.

Typically, the $NH_4Cl$ by-product will crystallize at sufficiently cool locations in the reactor exhaust circuit and eventually plug or clog the exhaust circuit. The problem of exhaust clogging or plugging affects process pressure control resulting in shut-down of the LPCVD apparatus. Preventive maintenance requires lengthy disassembly and cleaning procedures reflecting in increased manufacturing cost due to lower equipment utilization.

SUMMARY OF THE INVENTION

Current semiconductor chemical processes demand less maintenance, more uptime, and product yield enhancement through efficient reduction of process solid buildup. One solution that is effective for reducing these contaminates in pump lines is the combined use of heated lines and a vapor sublimation trap. The vapor sublimation trap draws in effluent vapors and solidifies them before they have a chance to backstream to the reaction chamber, contaminating and hazing the semiconductor substrates. It also prevents vapors and particles from entering and damaging the vacuum pump.

Semiconductor CVD and etch processes produce gaseous by-products that can readily be pumped out of the reaction chamber. However, they usually solidify in a vacuum pipe line since the line temperature is lower than the reaction chamber. A clogged line means longer down time and lower product yield, especially with the trend of larger wafers and smaller feature size.

LPCVD silicon nitride process deposits solid silicon nitride on the semiconductor substrate and creates an ammonium chloride ($NH_4Cl$) by-product. Ammonium chloride will solidify in the vacuum pump line if the line is not heated. To keep $NH_4Cl$ in its vapor stage, the system temperature must be from 130 to 150° C. at 150 m Torr. This allows the evacuation system to transport it away from the reactor.

The present invention contemplates a low pressure chemical vapor deposition apparatus which includes a process reactor having a chamber with a coating region for coating a substrate and an exhaust region communicating with the coating region. The coating region includes means for introduction of a source material to react with the substrate to form a protective layer thereon. The exhaust region includes means for drawing effluent vapors produced in the reaction chamber through an outlet port.

LPCVD silicon nitride process deposits solid silicon nitride on the substrate and creates an ammonium chloride $NH_4Cl$ by-product. The substrate is supported in the coating region and heated to an elevated reaction temperature by suitable support means and heating means.

The apparatus comprises means disposed in the exhaust circuit, preferably between the exhaust port and pumping means for condensing $NH_4Cl$ vapor into a solid phase and holding the solids from entry into the pumping means. The exhaust circuit comprises a combination of valves, cold traps, cooling and heating elements to remove the by-product vapor from the exhaust circuit and means for minimizing the volume of solid $NH_4Cl$ residing therein.

The present invention provides a method and apparatus that maintains a controlled and minimum volume of $NH_4Cl$ solids thereby substantially reducing production downtime needed for disassembly and cleaning of the cold trap.

It is an object of the present invention to provide an improved LPCVD apparatus and method wherein the collection of $NH_4Cl$ vapor and particles produced in the reactor during a silicon nitride growth process prevents backstreaming and vacuum pump damage.

It is another object of the present invention to provide an improved apparatus and method wherein the volume of condensed and collected $NH_4Cl$ solids is maintained at a minimum level thereby avoiding process control problems and damage to the semiconductor substrates being processed in the reactor.

It is still another object of the invention to reduce the frequency of disassembly and cleaning of the equipment, hence, increasing equipment utilization.

DESCRIPTION OF THE DRAWINGS

FIGS. 1a, 1b and 1c are schematic views of several vapor exhaust circuits of the prior art.

DETAILED DESCRIPTION OF THE PREFERRED EMBODIMENT

Figure 4:
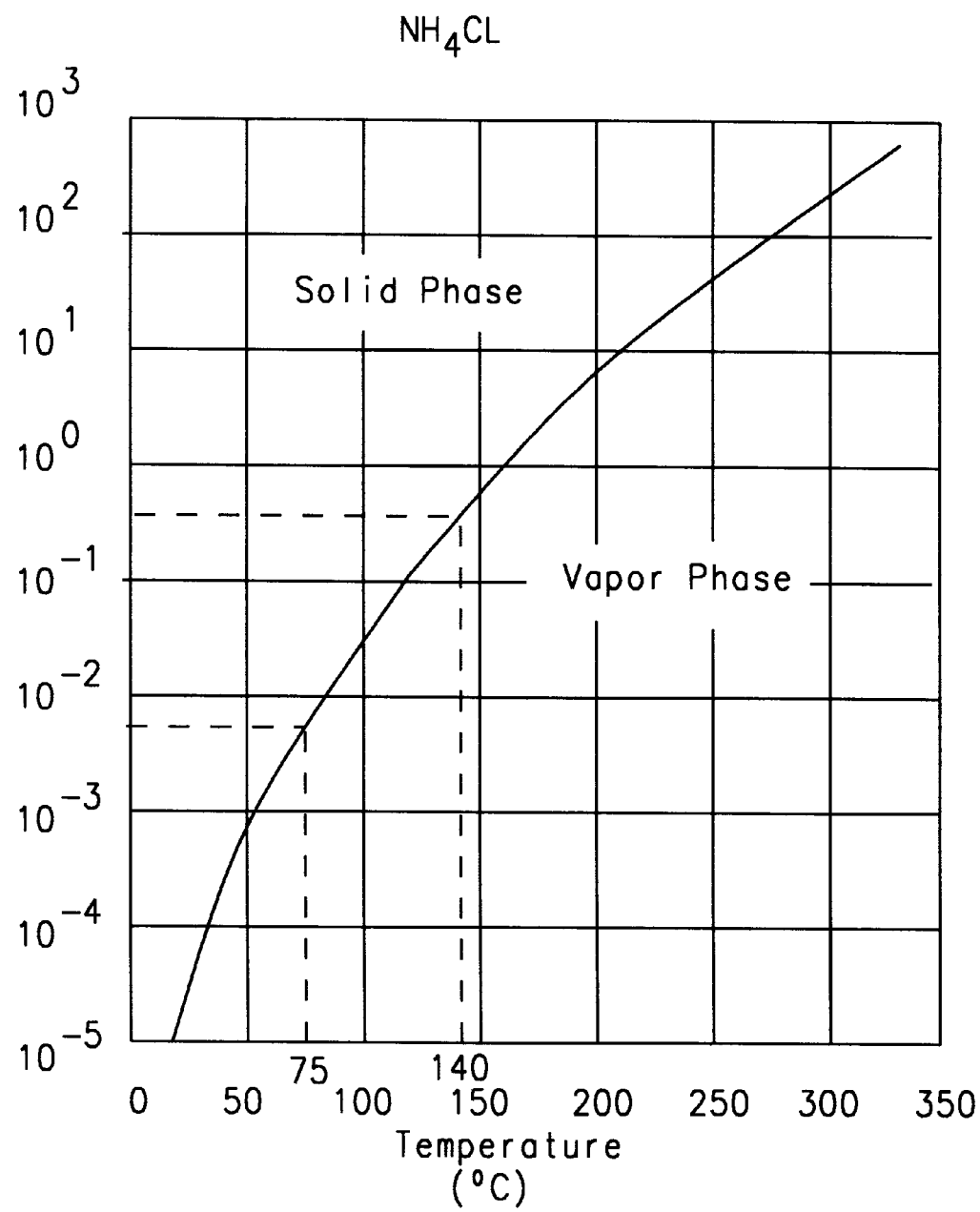
FIG. 4 is a vapor pressure curve for $NH_4Cl$.

Referring first to FIG. 4 illustrating a vapor pressure curve for $NH_4Cl$, accordingly, delineating the vapor to solid transition of $NH_4Cl$ as a function of temperature versus pressure. The present invention is predicated on the fact that a temperature of 75° C. or greater and a pressure of $3 \times 10^{-3}$ Torr will vaporize $NH_4Cl$ from a solid phase. This fact allows the vaporization and volume reduction of $NH_4Cl$ solids in the exhaust circuit using only moderate heat and pressures.

Figure 2:
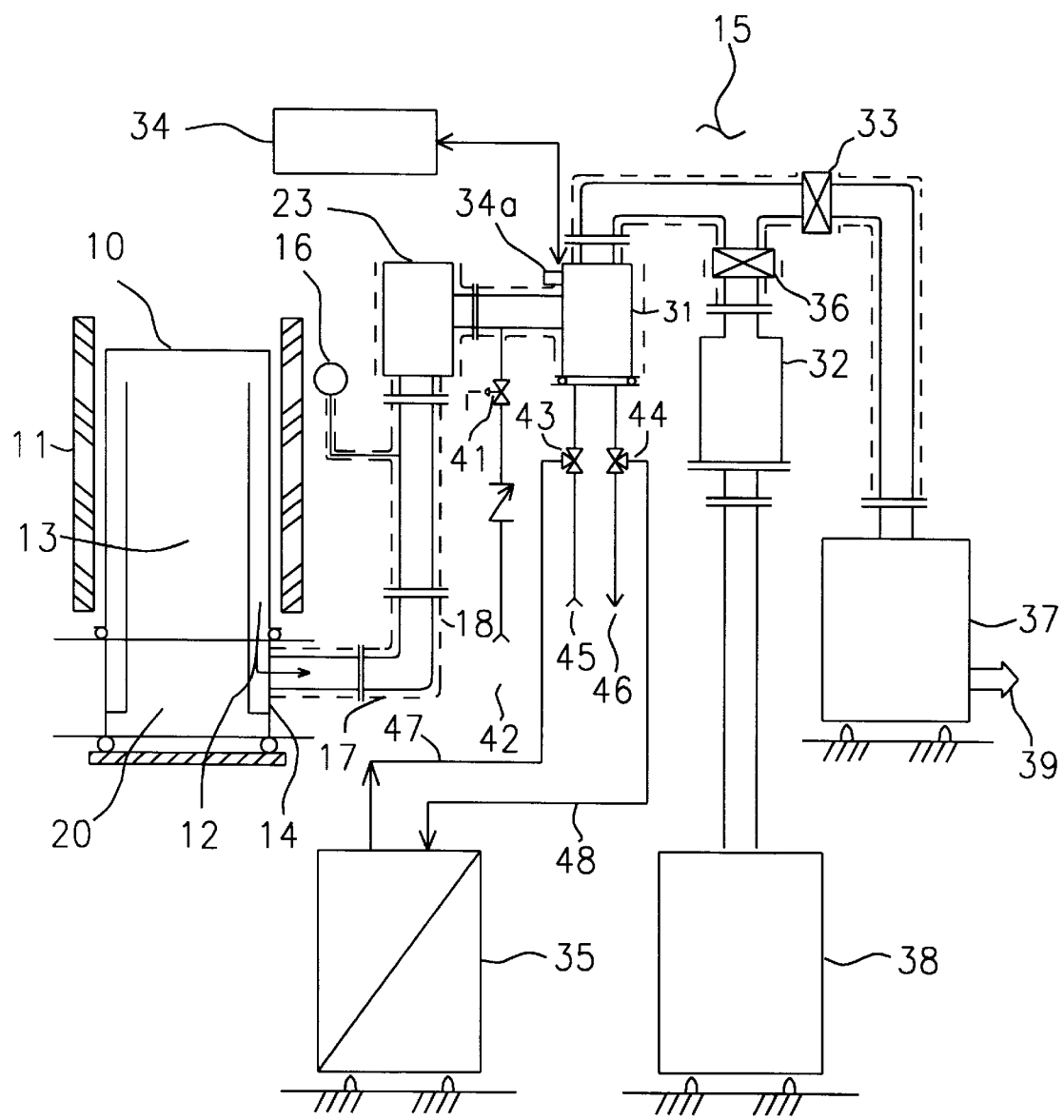
FIG. 2 is a partial construction diagram of an exhaust circuit embodiment of the present invention.

Referring to FIG. 2, a LPCVD coating system is schematically illustrated as including process reactor 10 having a chamber 11 with a coating region 13 for coating a substrate, not shown, and an exhaust region 12 communicating with the coating region 13. The coating region includes means for introduction of a source material made up of diclorosilane and ammonia, not shown, and heated to react with the substrate to form a protective layer thereon while producing a $NH_4Cl$ vapor by-product. The exhaust region 12 include means for drawing the $NH_4Cl$ vapors produced in the reaction chamber through a reactor outlet port 14 and into the gas evacuation circuit 15.

In one embodiment of the invention, as illustrated by FIG. 2, an insulated and heated vacuum conduit 17 starting at process reactors outlet port 14 conducts a vacuum environment throughout the vacuum circuit. The vacuum circuit bifurcates adjacent the outlet port of sublimation trap 31. A first path emerging after valve 33 and a second path emerging after valve 36, both terminating at pumps 37, 38, respectfully.

During a typical LPCVD coating cycle, a semiconductor substrate and a source material, made up of dichlorosilane and ammonia, not shown, are loaded into the coating region 13, heat controller 34 is off, valve 33 is opened and vacuum pumps 37 and 38 are on. The process reactor is secured and sealed for pumping to reduce its pressure A two stage valve 23 is opened. Valve 23 is an isolation valve that allows for slow pumping of a vacuum system. The valve's two stages consist of a small bypass valve and a main isolation valve. The bypass valve creates a small opening for the initial pump down, slowing the system evacuation. This reduces the contamination induced by particulate turbulence and damage due to sudden pressure change. When the process pressure and temperature are reached the vapor deposition cycle begins.

The deposition of the dichlorosilane and ammonia onto the semiconductor substrate produces an ammonium chloride, $NH_4Cl$, vapor byproduct. The vapor is evacuated through outlet port 14. As the $NH_4Cl$ vapor cools, crystallization begins at temperatures below 75° C. and pressures greater than $3 \times 10^{-3}$ Torr. Cooling occurs immediately, a mix of vapor and crystals enter the outlet port 14. As the vapor/crystal mix is removed through outlet port 14, the vapor/crystal mix is drawn in, condensed, and held in sublimation trap 31.

At the completion of the deposition cycle, main valve 23 and valve 33 are closed to isolate the first path of the vacuum circuit. Valve 36 is opened to allow pump down of a second path by vacuum pump 38. The second path has a cold trap 32, containing an absorbent to assimilate the $NH_4Cl$ vapor, is disposed intermediate sublimation trap 31 and vacuum pump 38 communicating only when valve 36 is opened. During the product unload/load time interval, heat controller 34 is turned on, mixing valves 43 and 44 are opened permitting hot and cold water to circulate to heat surfaces of sublimation trap 31 to vaporize the solid $NH_4Cl$ therein. A thermo couple sensor 34a provides temperature feedback to a programmable heat controller 34 for controlling the cold and hot water mix through mixing valves 43 and 44. The heat controller maintains the ideal vapor phase conditions for eliminating and/or reducing the solid buildup in trap 31. The vapors and particulates are transferred into cold trap 32 and again condensed.

Prior to closing the valves that communicate with the second path, the vacuum environment created by pump 38 is exhausted to atmosphere valve 41 is opened allowing a nitrogen pressure to enter the vacuum conduit between main valve 23 and trap 31. Following the nitrogen purge, all valves are closed, valve 33 is opened for the next process cycle to begin.

Figure 3:
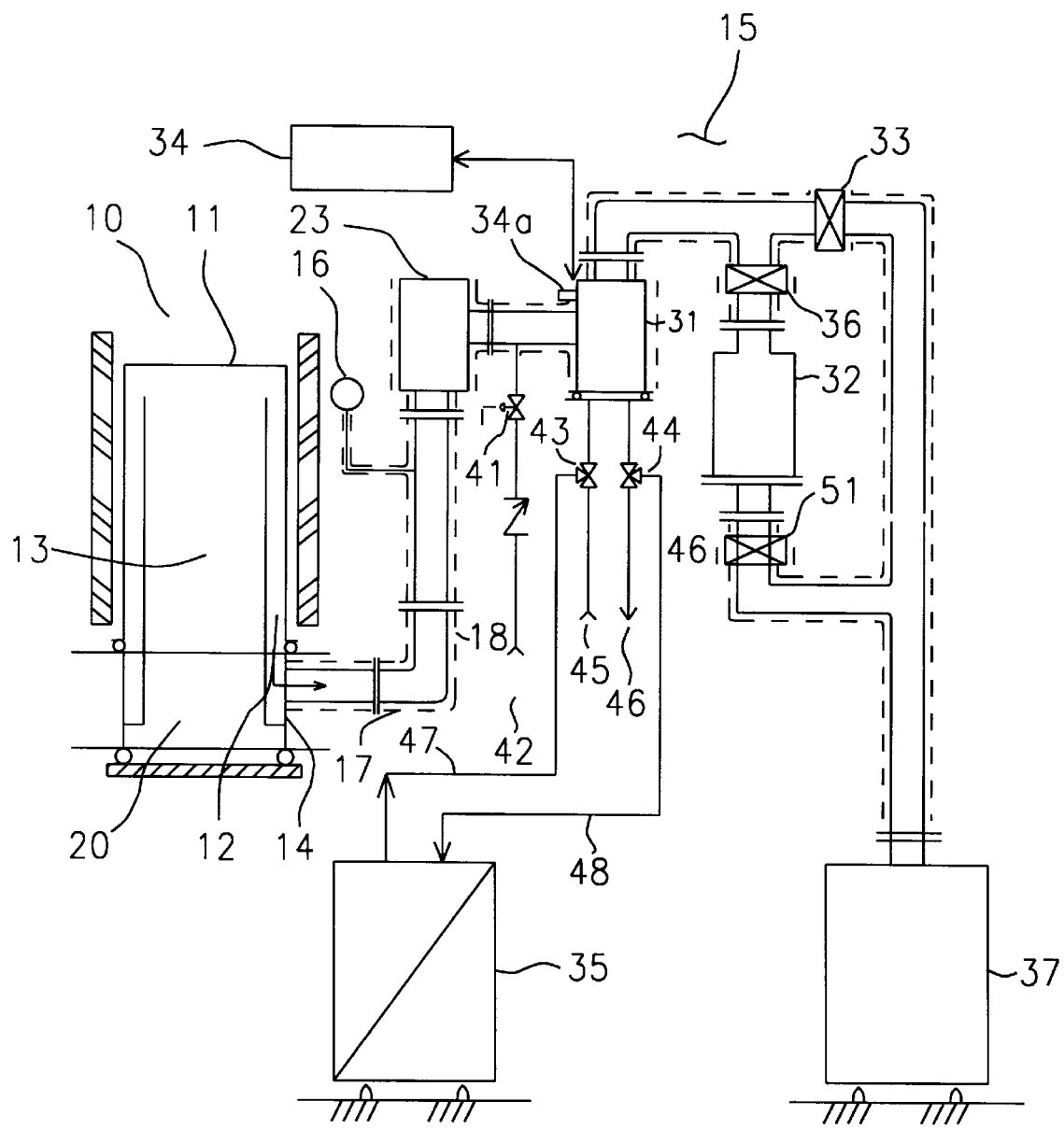
FIG. 3 is a partial construction diagram of an exhaust circuit of another embodiment of the present invention.

Referring to FIG. 3, a second embodiment of the invention is described. An insulated vacuum conduit 17 starting at process reactor's outlet port 14 conducts a vacuum environment throughout the vacuum circuit. The vacuum circuit bifurcates adjacent the outlet port of sublimation trap 31. A first path emerging after valve 33 and a second path emerging after valve 36. Cold trap 32 can be isolated from the first and second paths by the addition of valve 51 disposed at the output end of cold trap 32. With the addition of valve 51, only one vacuum pump 37 is needed. The operating sequence of the second embodiment is identical to the first embodiment with the exception of the opening and closing of valve 51. Its on and off sequence is the same as valve 36. Both are opened and closed during the same time interval.

Given the combination of sensors and feedback a tool controller can execute the operating sequence for the sublimation cycles and handling of the $NH_4Cl$ bi-product in the first exhaust path, leaving only the manual task of cleaning the condensate form the cold trap in the second path. The present invention reduces the frequency required for this manual cleaning task and can be done during the silicon nitride deposition process.

While the invention has been particularly shown and described with reference to the preferred embodiments thereof, it will be understood by those skilled in the art that various changes in form and details may be made without departing from the spirit and scope of the invention.

What is claimed is:

1. A method for depleting a condensed by-product held in an exhaust circuit of a low pressure chemical vapor deposition apparatus, said condensed by-product is generated in a vapor phase by a chemical reaction between a source material and a semiconductor substrate in a reactor of said low pressure chemical vapor deposition apparatus, the handling and depletion of said condensed by-product comprises the steps of:

placing a semiconductor substrate on a support in a process reactor for forming a protective layer thereon;

introducing at least one source material to the process reactor through a source material introducing means;

forming a protective layer on the semiconductor substrate from said at least one source material;

evacuating said condensed by-product generated by said chemical reaction in said process reactor;

providing a first path means and a second path means, in said exhaust circuit, for evacuating said condensed by-product, said first path means includes a temperature controlled sublimation trap for condensing and storing a condensed by-product and preventing said condensed by-product from backstreaming and damaging a first path vacuum pump; said second path means is disposed parallel to said first path means, said second path means includes an isolation valve, a cold trap, and an auxiliary vacuum pump;

providing a two-stage valve for isolating said first and second path means from the process reactor after completion of the low pressure chemical vapor deposition process;

providing a second isolation valve means disposed at an inlet of said first path vacuum pump for isolating said first path vacuum pump from said sublimation trap during a heating of condensed by-product solids held in said sublimation trap;

providing a cold trap isolation valve means disposed at an inlet of said cold trap for isolating an outlet of said sublimation trap from said cold trap during a nitride growth process.

2. The method of claim 1, wherein said sublimation trap's temperature can be decreased to condense the by-product generated in a vapor phase during the nitride growth process.

3. The method of claim 1, wherein said sublimation trap's temperature can be increased to vaporize the condensed by-product for removal from said sublimation trap after completion of the nitride growth process.

4. The method of claim 1, wherein said sublimation trap's temperature is sensed with a thennocouple and controlled with a programmable temperature tool controller.

5. The method of claim 1 demands less maintenance while increasing equipment utilization and enhancing product yield.

6. The method of claim 1, wherein dichlorosilane and ammonia are used as source gases.

7. A method of claim 6, wherein the purge gas is nitrogen.

8. A method of claim 7, wherein the second path cold trap contains an absorbent that is selected based on a composition of the source gas.

9. An apparatus for depleting a condensed by-product held in an exhaust 60 circuit of a low pressure chemical vapor deposition tool, said condensed by-product is generated in a vapor phase by a chemical reaction between a source material and a semiconductor substrate in a reactor of said low pressure chemical vapor deposition tool, said apparatus for handling and depletion of said condensed by-product comprising a process reactor for carrying out a low pressure chemical vapor growth process for forming a protective layer on a semiconductor substrate;

exhaust means for evacuating a condensed by-product generated by said chemical reaction in said process reactor;

a first path means for evacuating said condensed by-product, said first path means includes a sublimation trap for condensing and storing a condensed by-product and preventing said condensed by-product from backstreaming and from damaging a first path vacuum pump; and a second path means disposed parallel to said first path means, said second path means including an isolation valve, a cold trap, and an auxiliary vacuum pump;

a two-stage valve for isolating said first and second path means from the process reactor after completion of the low pressure chemical vapor deposition process;

a second isolation valve means disposed at an inlet of said first path vacuum path for isolating said first path vacuum path from said sublimation trap during a heating of condensed by-product solids held in said sublimation trap;

a cold trap isolation valve means disposed at an inlet of said cold trap for isolating an outlet of said sublimation trap from said cold trap during a nitride growth process.

10. The apparatus of claim 9, wherein said sublimation trap's temperature can be adjusted to condense the by-product generated in a vapor phase during the nitride growth process.

11. The apparatus of claim 9, wherein said sublimation trap's temperature can be adjusted to vaporize the condensed by-product for removal from said sublimation trap after completion of the nitride growth process.

12. The apparatus of claim 9, wherein said sublimation trap's temperature is sensed with a thermocouple and controlled with a programmable temperature tool controller.

13. The apparatus of claim 9, wherein heating all pumping lines and vacuum components, including valves in said first path, reduces solid build-up.

14. The apparatus of claim 9, wherein an option is given for eliminating said auxiliary vacuum pump by the addition of an isolation valve disposed at the outlet of said cold trap and connecting an outlet port of said isolation valve with said first path adjacent said inlet of said first path vacuum pump.

15. The apparatus of claim 9, whereby removing a condensed by-product from said sublimation trap by heating said condensed by-product to a vaporization temperature to form a vaporized by-product and evacuating said vaporized by-product into said cold trap during a product load/unload interval, demands less maintenance, increases equipment utilization and enhances product yield.

* * * * *